US010469058B1

(12) United States Patent
Lallement et al.

(10) Patent No.: US 10,469,058 B1
(45) Date of Patent: Nov. 5, 2019

(54) LEAKAGE-BASED OSCILLATOR WITH DIGITAL CORRECTION

(71) Applicant: STMicroelectronics (Crolles 2) SAS, Crolles (FR)

(72) Inventors: Guenole Lallement, Grenoble (FR); Fady Abouzeid, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/990,944

(22) Filed: May 29, 2018

(51) Int. Cl.
*H03K 3/013* (2006.01)
*H03K 3/012* (2006.01)
*H03K 3/03* (2006.01)

(52) U.S. Cl.
CPC ............ *H03K 3/013* (2013.01); *H03K 3/012* (2013.01); *H03K 3/0315* (2013.01)

(58) Field of Classification Search
None
See application file for complete search history.

(56) References Cited

U.S. PATENT DOCUMENTS

| 9,018,987 B1* | 4/2015 | Lahiri | H03K 3/0315 |
| | | | 327/114 |
| 2010/0301951 A1* | 12/2010 | Xue | H03K 3/0322 |
| | | | 331/57 |
| 2011/0090015 A1* | 4/2011 | Sumita | H03K 3/0315 |
| | | | 331/56 |
| 2013/0187708 A1* | 7/2013 | Dang | H03K 9/08 |
| | | | 329/312 |
| 2016/0156360 A1* | 6/2016 | Chen | H03K 3/011 |
| | | | 331/44 |
| 2018/0375523 A1* | 12/2018 | Yu | H03L 7/235 |

OTHER PUBLICATIONS

Scholl, Markus et al., "A 80 nW, 32 kHz charge-pump based ultra low power oscillator with temperature compensation," 42nd European Solid-State Circuits Conference, 2016, pp. 343-346.
Shrivastava, Aatmesh et al.: "A 150nW, 5ppm/oC, 100kHz On-Chip clock source for ultra low power SoCs," Proceedings of the IEEE 2012 Custom Integrated Circuits Conference, 2012, 4 pages.

* cited by examiner

*Primary Examiner* — Lincoln D Donovan
*Assistant Examiner* — Khareem E Almo
(74) *Attorney, Agent, or Firm* — Crowe & Dunlevy

(57) ABSTRACT

A multi-stage ring oscillator generates an output clock signal having a frequency which is dependent on a digitally leakage current that is applied to each stage of the multi-stage ring oscillator. A magnitude of a leakage current sourced by each digitally controlled leakage current source is set by a control circuit in response to a selection signal. A calibration circuit processes a reference clock signal and the output clock signal generated by the multi-stage ring oscillator to make adjustment to the selection signal which drives a locking of a frequency of the output clock signal to a desired frequency.

33 Claims, 4 Drawing Sheets

LEAKAGE-BASED OSCILLATOR WITH DIGITAL CORRECTION

TECHNICAL FIELD

The present invention relates to a clock reference circuit and, more particularly, to an ultra-low power clock reference circuit.

BACKGROUND

A clock source is a basic required building block of any digital System on Chip (SoC). For example, a low frequency clock may be utilized as a real time clock (RTC) for the circuit or as an input reference clock. The device which utilizes such an SoC solution is quite often battery operated, and in this ultra-low power (ULP) application environment it is critical that the clock source possess an inherent low power consumption as well as an operation that is insensitive to process, voltage and temperature (PVT) variation.

There are a number of well-known solutions for implementing ULP clock sources. One conventional approach utilizes a quartz oscillator (XTAL) because such a clock source has a very stable frequency and low deviation over time. However, this XTAL solution has a high area overhead, generally exhibits a slow starting time/power tradeoff characteristic, and cannot be fully integrated. Another solution uses complementary metal oxide semiconductor (CMOS) circuits for LC resonators or relaxation circuits based on switching capacitors which advantageously support full integration and frequency stability over PVT variation, but operate with increased power consumption as well as increased component counts and sizes. Another solution is an ULP ring oscillator (RO), but the inherent structures of the circuit tend to be highly sensitive to PVT variation. On-chip oscillators using leakage currents have also been proposed, but the accuracy of the timer is not very well controlled across the fabrication process thus necessitating a need for an accompanying calibration circuit.

SUMMARY

In an embodiment, a circuit comprises: a multi-stage ring oscillator configured to generate an output clock signal, wherein each stage of the multi-stage ring oscillator is biased by a digitally controlled leakage current source; a control circuit configured to generate a selection signal that sets a magnitude of a leakage current sourced by each digitally controlled leakage current source, wherein a frequency of the output clock signal is dependent on said magnitude of the leakage current; and a calibration circuit configured to process a reference clock signal and the output clock signal generated by the multi-stage ring oscillator and adjust the selection signal to cause a ratio of the frequency of the output clock signal to a frequency of the reference clock signal to lock to a target frequency ratio.

In an embodiment, a circuit comprises: a multi-stage ring oscillator configured to generate an output clock signal, wherein each stage of the multi-stage ring oscillator is biased by a digitally controlled leakage current source; a control circuit configured to generate a selection signal that sets a magnitude of a leakage current sourced by each digitally controlled leakage current source, wherein a frequency of the output clock signal is dependent on said magnitude of the leakage current; and a calibration circuit configured to process a reference clock signal and the output clock signal generated by the multi-stage ring oscillator and adjust the selection signal to change the frequency of the output clock signal. The calibration circuit comprises: a first circuit configured to generate a first error signal indicative of a difference between the reference clock signal and the output clock signal; and a proportional-integral circuit configured to generate a control signal from which the selection signal is generated in response to the first error signal.

In an embodiment, a calibration circuit is presented for calibrating an oscillator circuit that receives a selection signal which sets a frequency of an output clock signal generated by the oscillator circuit. The calibration circuit comprises: a first circuit configured to generate a first error signal indicative of a difference between a reference clock signal and the output clock signal; a second circuit configured to determine whether the first error signal is within an offset from zero and if so generate a second error signal; a third circuit configured to subtract the second error signal from the first error signal to generate a third error signal; and a proportional-integral circuit configured to generate a control signal from which the selection signal is generated in response to the third error signal.

In an embodiment, a calibration circuit is presented for calibrating an oscillator circuit that receives a selection signal which sets a frequency of an output clock signal generated by the oscillator circuit. The calibration circuit comprises: a proportional-integral circuit configured to generate a control signal from which the selection signal is generated; a first circuit configured to generate a first error signal indicative of a difference between a reference clock signal and the output clock signal; a second circuit configured to determine if the control signal is saturated and if so generate a second error signal; and a third circuit configured to subtract the second error signal from the first error signal to generate a third error signal. Said proportional-integral circuit is configured to generate the control signal in response to the third error signal.

BRIEF DESCRIPTION OF THE DRAWINGS

For a better understanding of the embodiments, reference will now be made by way of example only to the accompanying figures in which.

DETAILED DESCRIPTION

Figure 1:
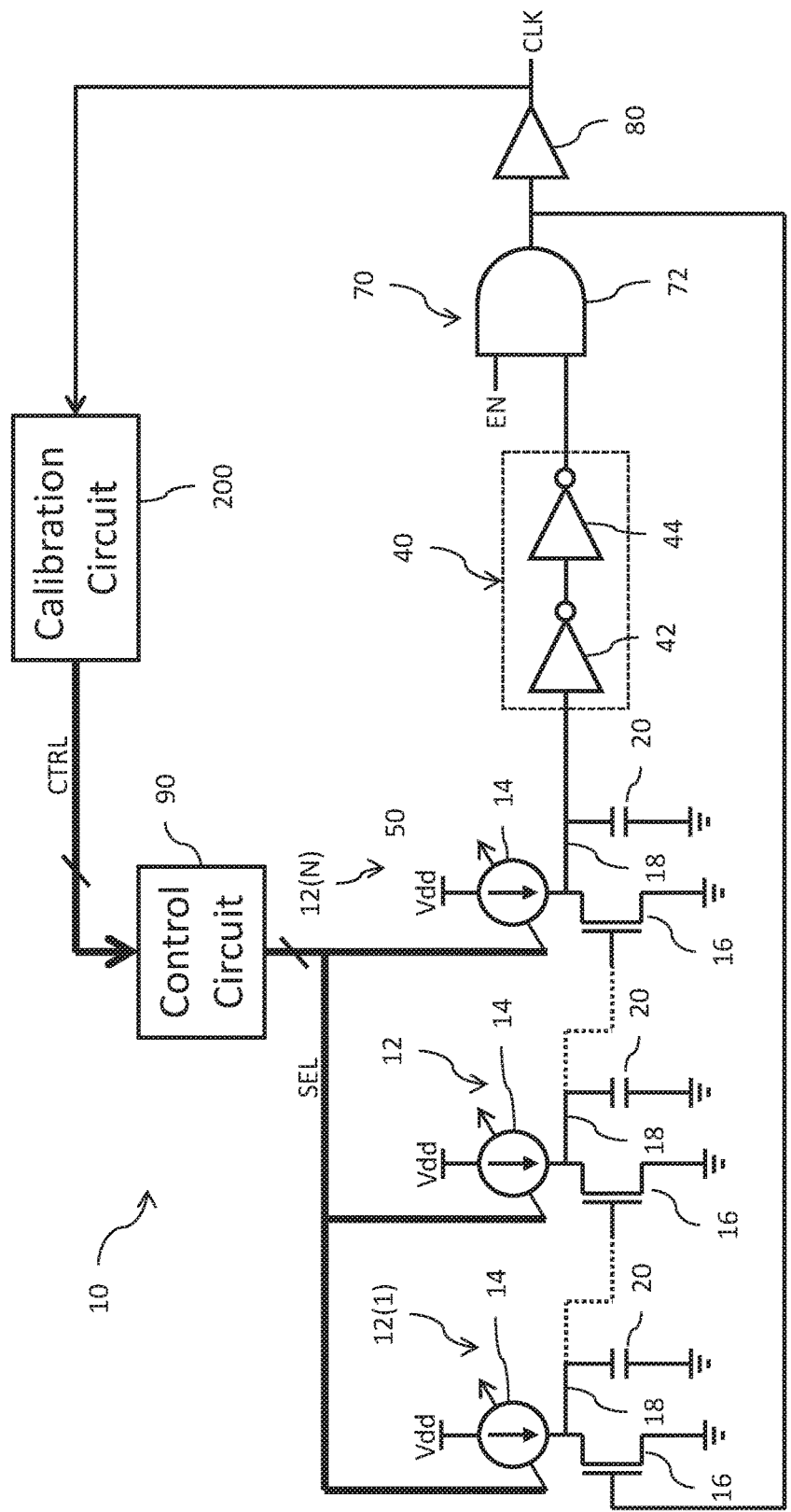
FIG. 1 is a circuit diagram of a multi-stage ring oscillator circuit.

Reference is now made to FIG. 1 which shows a circuit diagram of a multi-stage ring oscillator (RO) circuit 10. The RO circuit 10 has a leakage-based design. Each stage 12 of the RO circuit 10 is formed by a leakage current source 14 coupled in series with the source-drain path of an n-channel MOS field effect transistor (FET) 16. More specifically, the leakage current source 14 is supplied from a supply node (for example, Vdd) and operates to source a leakage current Ileak having a selectable current magnitude to an intermediate node 18 coupled to the drain terminal of the transistor 16. The source terminal of the transistor 16 is coupled to a reference node (for example, ground). A capacitor 20 has a first terminal coupled to node 18 and a second terminal coupled to the reference node. The N stages 12(1) to 12(N) are coupled in cascade with the node 18 in one stage 12(n)

coupled to the gate terminal of the transistor 16 in a next subsequent stage 12(n+1). The node 18 of the last stage 12(N) is coupled to the gate terminal of the transistor 16 in the first stage 12(1) using a feedback loop to provide a negative feedback necessary for the circuit to oscillate and generate a clock signal CLK. The circuit 10 includes an odd number of cascaded stages 12 (for example, five stages where N=5).

In an embodiment, the capacitance for the capacitor 20 is provided by the gate capacitance of the transistor 16 and an inherent parasitic capacitance of the node 18. This solution avoids the addition of bulky components, such as a specifically provided integrated capacitor (for example, of the metal-insulator-metal (MIM) type), but does require a specific effort to be made during circuit layout design to properly size the components and wiring to support oscillation. It will be understood, however, that in another embodiment the capacitor 20 may be implemented as a non-inherent and non-parasitic component (such as with use of an integrated capacitor).

The signal at the node 18 of the last stage 12(N) is applied to the input of a matching circuit 40 of the feedback loop. The matching circuit 40 functions to help maintain the dynamic swing of the generated clock signal between the Vdd supply node voltage and the ground reference node voltage. The matching circuit 40 includes a first CMOS logic invertor 42 coupled in cascade with a second CMOS logic invertor 44.

The feedback loop of the RO circuit 10 further includes an enable circuit 70 formed by a logic AND gate 72 having a first input configured to receive the clock signal output from the matching circuit 40 and a second input configured to receive an enable signal EN. An output of the AND gate 72 is coupled to the gate terminal of the MOSFET 16 of the first stage 12(1) and is further coupled to an output buffer circuit 80 which outputs the clock signal CLK. When the enable signal EN is logic low, the output of the AND gate is also logic low and the RO circuit 10 does not oscillate. Conversely, when the enable signal EN is logic high, the output of the AND gate (logic low or logic high) is passed to the first stage 12 and the RO circuit 10 oscillates.

The RO circuit 10 operates at an ultra-low Vdd supply voltage in the range of 0.4V to 0.6V (for example, at 0.5V).

In an embodiment, the matching circuit 40 and enable circuit 70 may be omitted with the node 18 of the last stage 12 being directly coupled to the gate terminal of the transistor 16 in the first stage 12 using a feedback loop to provide a negative feedback and further coupled to the input of the buffer 80. At ultra-low Vdd voltage levels, however, for example, Vdd=0.5V, the matching circuit 40 and enable circuit 70 are required.

A control circuit 90 generates a digital multi-bit select signal SEL which is applied to control the magnitude of the leakage current Ileak generated by each of the leakage current sources 14. The frequency of the generated clock signal CLK is dependent on the magnitude of the current Ileak in accordance with the following formula:

$$f_{CLK} \propto \frac{Ileak}{C * Vth}$$

where: Ileak is the magnitude of the current Ileak as selected by the selection signal SEL; C is the capacitance of the capacitor 20; and Vth is the threshold voltage of the transistor 16.

Figure 2:
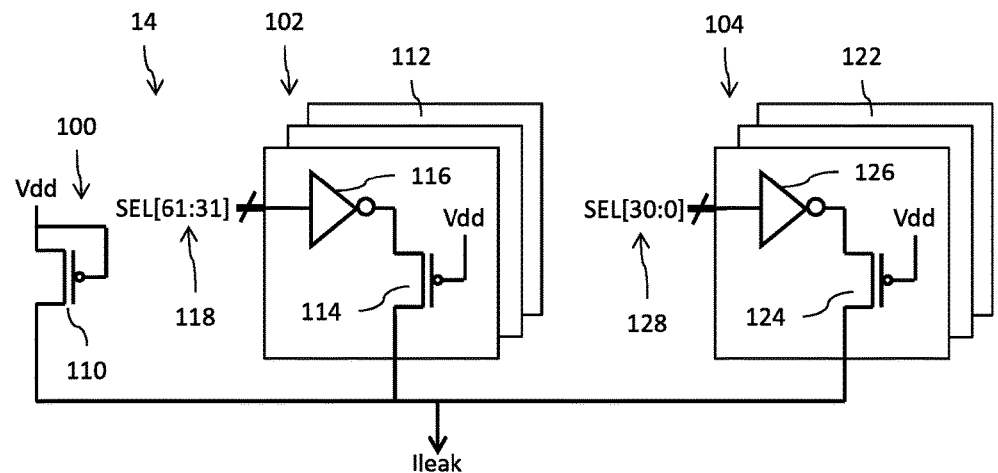
FIG. 2 is a circuit diagram of a digitally controlled current source.

Each leakage current source 14 may be implemented as a digitally controlled current source having a circuit as shown in FIG. 2. The leakage current source 14 includes a fixed leakage current source circuit 100, a coarse step leakage current source circuit 102 and a fine step leakage current source circuit 104. The leakage current Ileak is the sum of the individual leakage currents output from circuit 100, circuit 102 and circuit 104.

The fixed leakage current source circuit 100 may be implemented as a p-channel MOSFET 110 having its source terminal and gate terminal coupled to the Vdd supply node (i.e., configured in the off condition) and having its drain terminal coupled to a current summing junction where the leakage current Ileak is output. The p-channel MOSFET 110 is preferably a low voltage threshold (LVT) device which means that the threshold voltage of the transistor is relatively low such that the transistor operates with a relatively fast switching characteristic (but has a relatively high leakage current). The p-channel MOSFET 110 is sized such that a sufficient magnitude of the current Ileak is supplied to guarantee oscillation of the clock CLK signal in the absence of current contribution from the coarse step leakage current source circuit 102 and the fine step leakage current source circuit 104.

The coarse step current source circuit 102 may be implemented by a plurality of coarse leakage current stages 112, wherein each coarse leakage current stage 112 is formed by a p-channel MOSFET 114 having its gate terminal coupled to the Vdd supply node, its source terminal coupled to the output of a CMOS inverter circuit 116 and its drain terminal coupled to the current summing junction where the leakage current Ileak is output. The p-channel MOSFET 114 is preferably a low voltage threshold (LVT) device. Each CMOS inverter circuit 116 is coupled to receive one bit of a first vector 118 of the select signal SEL. The amount of leakage current contributed by the coarse step leakage current source circuit 102 is accordingly dependent on how many of the p-channel MOSFETs 114 are enabled by their associated CMOS inverter circuit 116 in response to the bits of the first vector 118 of the select signal SEL. If the bit is logic "1", the source of the transistor 114 is pulled below the Vdd gate voltage and the transistor is fully shut off. Conversely, if the bit is logic "0", the source and gate of the transistor are both at Vdd and a leakage current passes to be contributed at the current summing junction to form the leakage current Ileak.

The fine step current source circuit 104 may be implemented by a plurality of fine leakage current stages 122, wherein each fine leakage current stage 122 is formed by a p-channel MOSFET 124 having its gate terminal coupled to the Vdd supply node, its source terminal coupled to the output of a CMOS inverter circuit 126 and its drain terminal coupled to the current summing junction where the leakage current Ileak is output. The p-channel MOSFET 124 is preferably a regular voltage threshold (RVT) device which means that the threshold voltage of the transistor is relatively normal such that the transistor operates with a standard switching characteristic (and has a standard leakage current). Each CMOS inverter circuit 126 is coupled to receive one bit of a second vector 128 of the select signal SEL. The amount of current contributed by the fine step leakage current source circuit 104 is accordingly dependent on how many of the p-channel MOSFETs 124 are enabled by their associated CMOS inverter circuit 126 in response to the bits of the second vector 128 of the select signal SEL. If the bit is logic "1", the source of the transistor 124 is pulled below the Vdd gate voltage and the transistor is fully shut off.

Conversely, if the bit is logic "0", the source and gate of the transistor are both at Vdd and a leakage current passes to be contributed at the current summing junction to form the leakage current Ileak.

The body terminals of the transistors 110, 114 and 124 are coupled to receive a body bias voltage Vdds (not explicitly shown). In an embodiment, the body bias voltage Vdds is equal to Vdd. In an embodiment, the voltage Vdds is applied to the back gate of the transistors 110, 114 and 124 to ensure proper operating conditions for those transistors.

As an example, the coarse step leakage current source circuit 102 may be implemented by thirty-one coarse leakage current stages 112 and thus the first vector 118 of the select signal SEL may correspondingly include thirty-one bits SEL[61:31], and the fine step leakage current source circuit 104 may be implemented by thirty-one fine leakage current stages 122 and thus the second vector 128 of the select signal SEL may correspondingly include thirty-one bits SEL[30:0].

To ensure high linearity when adding one or more of the coarse leakage current stages 112 and/or fine leakage current stages 122 to contribute to the leakage current Ileak, a thermometric control approach is used. The control circuit 90 receives a multi-bit binary control signal CTRL for conversion to a thermometric code that is output as the select signal SEL. As an example, the binary control signal CTRL may comprise ten bits CTRL[9:0]. The control circuit 90 implements a binary to thermometric conversion with five bits of the binary control signal CTRL[9:5] being converted to thirty-one bits of the thermometric coded SEL[61:31] for the first vector 118 for coarse control, and five bits of the binary control signal CTRL[4:0] being converted to thirty-one bits of the thermometric coded SEL[30:0] for the second vector 128 for fine control.

Reaching a desired frequency of the clock signal CLK requires a corresponding select signal SEL for each corner case (FF—fast fast; FS—fast slow; SF—slow fast; SS—slow slow; and TT—typical). As a consequence, the first vector 118 of the select signal SEL is used to control the coarse step current source circuit 102 to compensate the large variation from process, while the second vector 128 of the select signal SEL is used to control fine step current source circuit 104 to handle small variation about the applicable corner.

As an example, the n-channel MOSFETs 16 may comprise regular voltage threshold (RVT) devices having a width of 80 nm and a length of 50 nm; the p-channel MOSFET 110 may comprise a low voltage threshold (LVT) device having a width of 80 nm and a length of 30 nm; the p-channel MOSFETs 114 may comprise a low voltage threshold (LVT) device having a width of 280 nm and a length of 30 nm; and the p-channel MOSFETs 124 may comprise regular voltage threshold (RVT) devices having a width of 270 nm and a length of 30 nm.

As a consequence of the use of a leakage-based design for the RO circuit 10, the circuit is very power efficient, but nonetheless is highly sensitive to PVT variations. Calibration methods are accordingly required so as to improve the overall frequency stability of the clock reference. An external digital feedback loop is implemented to compensate the variations. The reason for a digital solution selection is that high noise immunity can be achieved using a negligible power digital logic circuit with a crystal oscillator (XTAL) reference and a calibration circuit 200.

Figure 3A:
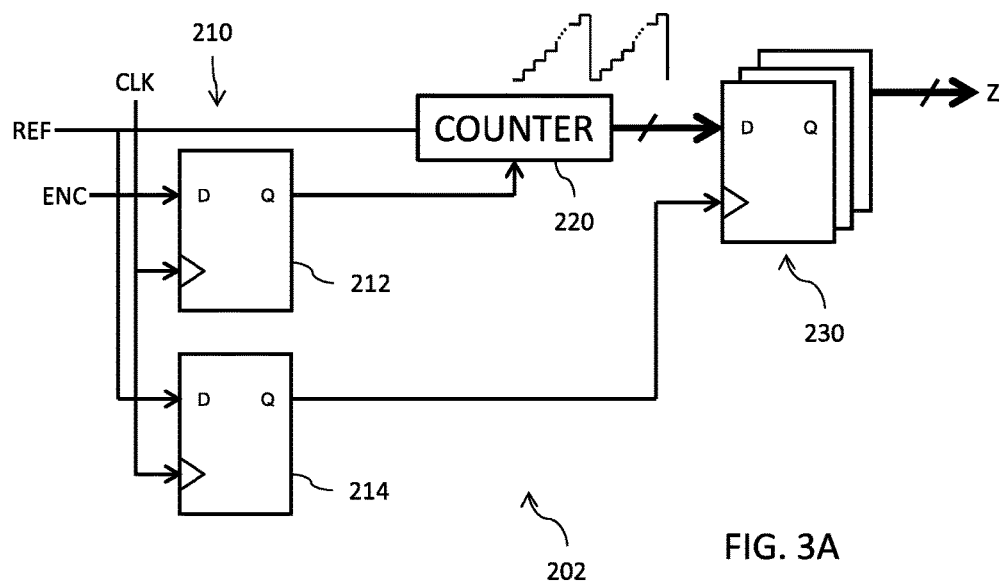
FIGS. 3A-3B show a block diagram of a calibration circuit.
Figure 3B:
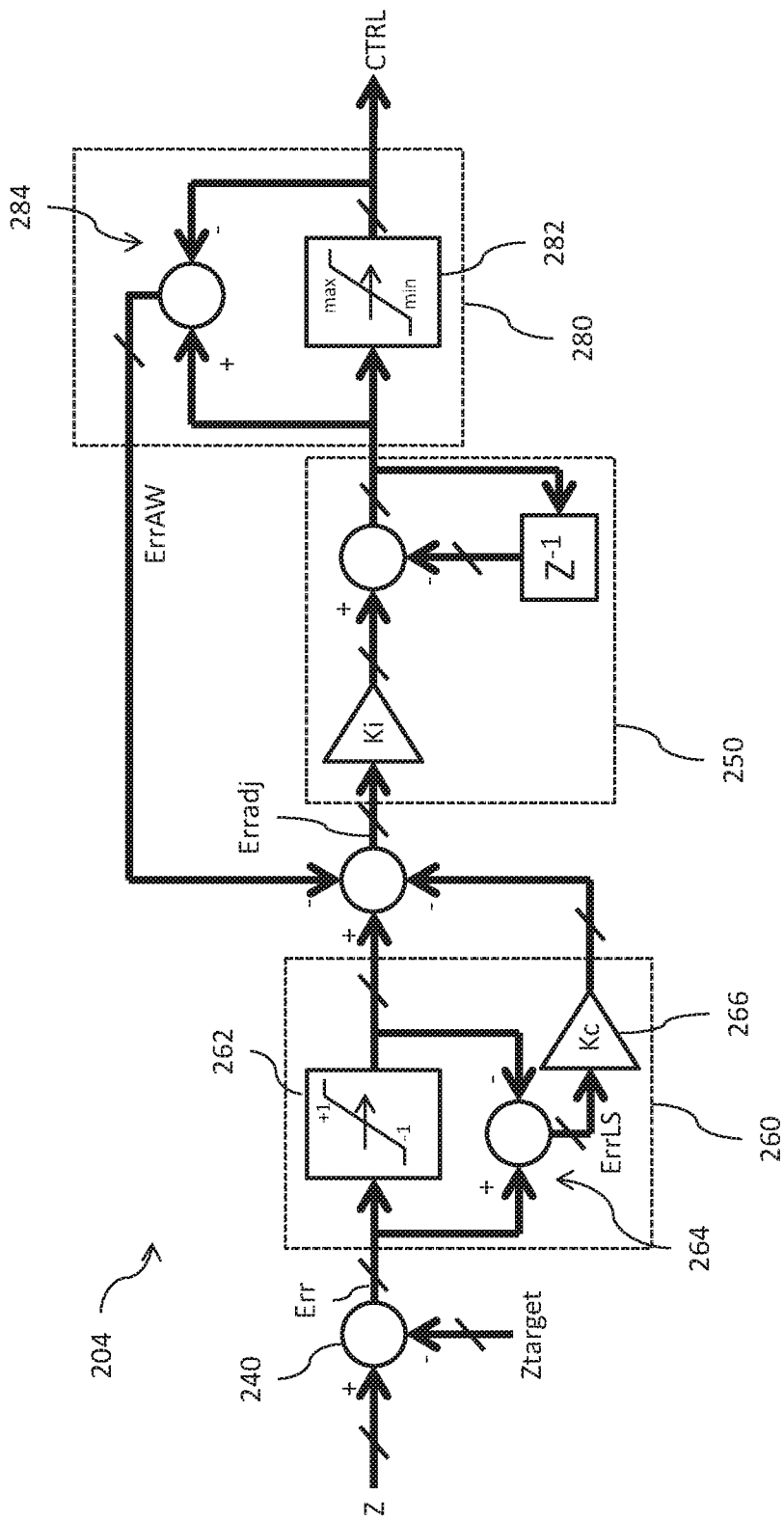

Reference is now made to FIGS. 3A-3B which show block diagrams for the calibration circuit 200. The calibration circuit 200 includes a synchronization and counting circuit 202 (FIG. 3A) and a compensation circuit 204 (FIG. 3B). The synchronization and counting circuit 202 receives the clock signal CLK and a reference clock REF and operates to produce a digital word Z which is indicative of a ratio of a frequency of the reference clock REF to a frequency of the clock signal CLK (or, a ratio of a period of the clock signal CLK to a period of the reference clock REF):

$$Z = \frac{f_{REF}}{f_{CLK}} = \frac{T_{CLK}}{T_{REF}}$$

In an embodiment, the reference clock REF is generated only when needed for calibration by a stable clock generator such as a crystal (XTAL) oscillator.

A synchronization circuit 210 includes a first flip-flop circuit 212 that is clocked by the reference clock REF and has a data input configured to receive a calibration enable signal ENC. The first flip-flop circuit 212 asserts its output in response to the leading edge of the reference clock REF if the calibration enable signal ENC is logic high, and deasserts its output in response to the leading edge of the reference clock REF if the calibration enable signal ENC is logic low. The synchronization circuit 210 further includes a second flip-flop circuit 214 that is clocked by the clock signal CLK and has a data input configured to receive the reference clock REF. The second flip-flop circuit 214 asserts its output in response to the leading edge of the clock signal CLK if the reference clock REF is logic high, and deasserts its output in response to the leading edge of the clock signal CLK if the reference clock REF is logic low.

A counter circuit 220 is clocked by the reference clock REF and reset by the output of the first flip-flop circuit 212. The counter circuit 220 operates to count a number of clock cycles and is reset in response to the logic low state of the calibration enable signal ENC. A flip-flop register circuit 230 latches the bits of the count value from the counter circuit 220 in response to the output of the second flip-flop circuit 214. The latched value is accordingly the number of cycles of the reference clock REF which occur in one cycle of the clock signal CLK, and thus is accordingly indicative of the ratio of the period of the clock signal CLK to the period of the reference clock REF (i.e., the ratio of the frequency of the reference clock REF to the frequency of the clock signal CLK). The latched value is output as the digital word Z.

The compensation circuit 204 receives the digital word Z for comparison against a target digital word Ztarget to produce an error signal Err. The target digital word Ztarget has a value equal to a ratio of a desired (i.e., target) frequency of the reference clock REF to a frequency of the reference clock REF clock signal CLK. An adder circuit 240 subtracts the target digital word Ztarget from the digital word Z to output the error signal Err. As a general indication of operation of the compensation circuit 204, the error signal Err is processed through a discrete proportional-integral (PI) circuit 250 that has a programmable integral gain Ki (where Ki is preferably small) to generate the binary control signal CTRL. Generally speaking, the binary control signal CTRL is accordingly equal to: CTRL=Ki(Err)*CTRL(Z−1), or in other words, the current value of the binary control signal CTRL is equal to the previous value of the binary control signal CTRL multiplied by Ki(Err).

To maximize the accuracy of the calibration operation, the compensation circuit 204 includes two additional processing operations that are performed with respect to the error signal Err and the generation of the binary control signal CTRL.

A first additional processing operation, performed by a low saturation circuit 260, addresses concerns with oscillations due to the discrete error. When a large frequency error is detected, a large gain will ensure a fast convergence to correct the error. Conversely, when the frequency error approaches zero, a smaller feedback gain is all that is needed to set the tuning word for the signal CTRL and target the correct output frequency for the clock CLK. The low saturation circuit 260 operates to detect instances where the magnitude of the error signal Err is very small (for example, within a certain offset from zero), and in response thereto adjust the effective gain of the compensation circuit 204 to achieve accuracy and high jitter tolerance. The adjustment in effective gain is accomplished by determining an error difference as a low saturation error signal ErrLS which is multiplied by a programmable gain Kc and subtracted from the error signal Err. When the low saturation circuit 260 is active, the binary control signal CTRL is accordingly equal to: CTRL=Ki(Err−Kc*ErrLS)*CTRL(Z$^{-1}$), or in other words, the current value of the binary control signal CTRL is equal to the previous value of the binary control signal CTRL multiplied by Ki(Err−Kc*ErrLS).

The low saturation circuit 260 comprises a detection circuit 262 that receives the error signal Err and operates to detect when the magnitude of the error signal Err is very small (such as within a certain offset from zero, wherein that certain offset could, for example, be set equal to ABS(Err) <1, where ABS indicates the absolute value operator.). In such a case, the detection circuit 262 enables a differencing circuit 264 to measure a difference between two consecutive samples of the error signal Err to generate the low saturation error signal ErrLS which is multiplied using a multiplication circuit 266 by a programmable gain Kc for subtraction from the error signal Err by adder 270 before being input to the discrete proportional-integral (PI) circuit 250. The output of the differencing circuit 264 may, for example, comprise a value of −1, 0 or +1 depending on the measured difference between two consecutive samples of the error signal Err.

A second additional processing operation, performed by an anti-windup circuit 280, addresses concerns with overshoot and continuous increase of the accumulated error. In the event that the error signal Err remains positive (or alternatively, negative) for an extended period of time, the signal CTRL will saturate at its minimum (or alternatively, maximum) value due to the limited number of controllable leakage current sources that are available in circuits 102 and 104. However, if the error remains positive (or alternatively, negative) after saturation is reached, the discrete proportional-integral (PI) circuit 250 will continue to accumulate the error. The accumulated error will cause the signal CTRL to remain in the saturated condition for an extended period of time. Compensation operation is delayed and may even become unstable. The anti-windup circuit 280 operates to detect instances where the signal CTRL is saturated, and in response thereto adjust the effective gain of the discrete proportional-integral (PI) circuit 250. The adjustment in effective gain is accomplished by determining an accumulated error difference as an anti-windup error signal ErrAW which is subtracted from the error signal Err. When the anti-windup circuit 280 is active, the binary control signal CTRL is accordingly equal to: CTRL=Ki(Err−ErrAW)*CTRL(Z$^{-1}$), or in other words, the current value of the binary control signal CTRL is equal to the previous value of the binary control signal CTRL multiplied by Ki(Err−ErrAW).

The anti-windup circuit 280 comprises a detection circuit 282 determines whether the binary control signal CTRL is saturated. In such a case, the detection circuit 282 enables a differencing circuit 284 to measure a difference between a saturated portion of the signal CTRL and the fully accumulated output of the discrete proportional-integral (PI) circuit 250 to generate the anti-windup error signal ErrAW which is subtracted from the error signal Err by adder 270 before being input to the discrete proportional-integral (PI) circuit 250.

As a result, the adjusted error signal Erradj which is input to the discrete proportional-integral (PI) circuit 250 is equal to: Erradj=Err−Kc*ErrLS−ErrAW. The binary control signal CTRL is accordingly equal to: CTRL=Ki(Err−Kc*ErrLS−ErrAW)*CTRL(Z$^{-1}$), or in other words, the current value of the binary control signal CTRL is equal to the previous value of the binary control signal CTRL multiplied by Ki(Err−Kc*ErrLS−ErrAW). This operation may be mathematically represented as follows:

$$CTRL = Ki * Erradj(t) + \frac{Ki}{Ti} \int_0^t Erradj(t)dt, \text{ or}$$

$$CTRL = Ki * Erradj(t) + \frac{Ki}{Ti} \sum_{i=1}^{nt} Erradj_i(t)\Delta t$$

where Ti is the integration constant and $\Delta t$ is the time between samples.

In an embodiment, the control signal CTRL is provided by a certain number of the most significant bits (MSBs) of the output from the discrete proportional-integral (PI) circuit 250. In an example, the control signal CTRL is the ten MSBs of a >10-bit signal output from the discrete proportional-integral (PI) circuit 250. This is the reason why the control signal CTRL can saturate while the discrete proportional-integral (PI) circuit 250 will continue to accumulate error. The saturated portion of the control signal CTRL would accordingly be the ten MSBs and the fully accumulated output of the discrete proportional-integral (PI) circuit 250 would be all bits. The difference between these two values is the error signal ErrAW.

The calibration circuit 200 uses the reference clock REF as the clocking element. So, the error signal Err is updated with each period of the clock signal CLK. The solution disclosed above accordingly helps to relax the design timing constraints by allowing the Ki multiplication of the proportional-integral (PI) control to be performed over multiple periods of the clock signal CLK.

Once locking is achieved, the calibration circuit 200, along with the XTAL oscillator for generating the reference clock REF, may be disabled in order to reduce power consumption.

The control circuit 90 and calibration circuit 200 are digital circuits which can be implemented in any suitable hardware, software, firmware, or a combination thereof, without departing from the scope of the invention.

Figure 4:
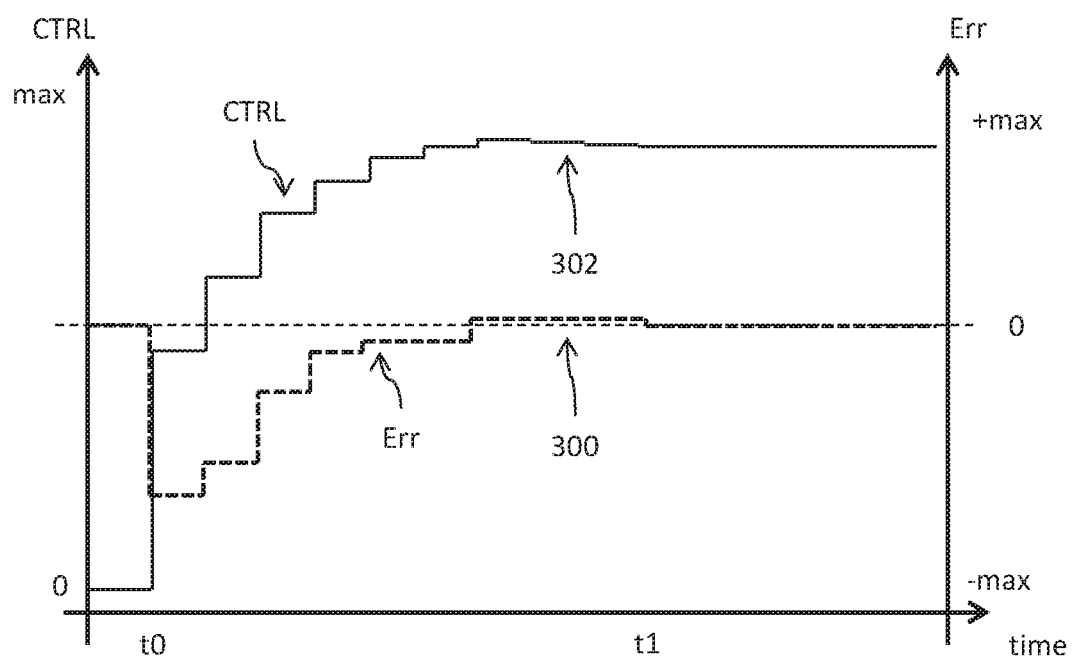
FIG. 4 illustrates an example calibration operation.

FIG. 4 illustrates an example calibration operation showing a typical locking cycle. Operation starts with the control signal CTRL at a value of "0" which would cause all transistors of the fixed leakage current source circuit 100, coarse step current source circuit 102 and fine step current source circuit 104 to contribute leakage current to the leakage current Ileak. At time t0, the calibration operation is enabled for operation. Lock is achieved at time t1. In an example embodiment, the time to lock (t1−t0) is equal to 0.342 ms for Vdd=0.5V and Temp=25° C. As the error approaches zero (reference 300), the effect that the low saturation circuit 260 has on the control signal CTRL due to the contribution of the low saturation error signal ErrLS is shown at reference 302.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A circuit, comprising:
a multi-stage ring oscillator configured to generate an output clock signal, wherein each stage of the multi-stage ring oscillator is biased by a separate digitally controlled leakage current source;
a control circuit configured to generate a selection signal that sets a magnitude of a leakage current sourced by each digitally controlled leakage current source, wherein a frequency of the output clock signal is dependent on said magnitude of the leakage current; and
a calibration circuit configured to process a reference clock signal and the output clock signal generated by the multi-stage ring oscillator and adjust the selection signal to cause a ratio of the frequency of the reference clock signal to a frequency of the output clock signal to lock to a target frequency ratio.

2. The circuit of claim 1, wherein the calibration circuit is disabled after lock is achieved.

3. The circuit of claim 1, further comprising a crystal oscillator circuit configured to generate said reference clock signal, wherein the crystal oscillator circuit is disabled after lock is achieved.

4. The circuit of claim 1, wherein the target frequency ratio is a ratio of a target frequency of the reference clock signal to the frequency of the output clock signal.

5. The circuit of claim 1, wherein the calibration circuit comprises:
a circuit configured to generate an error signal as a function of a difference between the target frequency ratio and said ratio; and
a proportional-integral circuit configured to receive the error signal and output a control signal from which the selection signal is generated.

6. The circuit of claim 5, wherein the control signal is binary coded and the selection signal is thermometric coded, and the control circuit is configured to convert the binary coded control signal to the thermometric coded selection signal.

7. The circuit of claim 1, wherein the calibration circuit comprises:
a first circuit configured to generate a first error signal as a function of a difference between the target frequency ratio and said ratio;
a second circuit configured to determine whether the first error signal is within an offset from zero and if so generate a second error signal which is subtracted from the first error signal to generate a third error signal; and
a proportional-integral circuit configured to receive the third error signal and output a control signal from which the selection signal is generated.

8. The circuit of claim 7, wherein the control signal is binary coded and the selection signal is thermometric coded, and the control circuit is configured to convert the binary coded control signal to the thermometric coded selection signal.

9. The circuit of claim 7, further comprising:
a difference circuit configured to generate a difference signal as a function of a difference between consecutive samples of the error signal; and
a multiplier circuit configured to multiply the difference signal by a gain value to generate the second error signal.

10. The circuit of claim 1, wherein the calibration circuit comprises:
a first circuit configured to generate a first error signal as a function of a difference between the target frequency ratio and said ratio;
a proportional-integral circuit configured to receive a second error signal and output a control signal from which the selection signal is generated; and
a second circuit configured to determine if the control signal is saturated and if so generate a third error signal which is subtracted from the first error signal to generate the second error signal.

11. The circuit of claim 10, wherein the control signal is binary coded and the selection signal is thermometric coded, and the control circuit is configured to the binary coded control signal to the thermometric coded selection signal.

12. The circuit of claim 10, further comprising a difference circuit configured to generate said third error signal as a function of a difference between the control signal and a saturated portion of the control signal.

13. The circuit of claim 11, wherein the difference is equal to an accumulated error of the proportional-integral circuit.

14. A circuit, comprising:
a multi-stage ring oscillator configured to generate an output clock signal, wherein each stage of the multi-stage ring oscillator is biased by a digitally controlled leakage current source;
a control circuit configured to generate a selection signal that sets a magnitude of a leakage current sourced by each digitally controlled leakage current source, wherein a frequency of the output clock signal is dependent on said magnitude of the leakage current; and
a calibration circuit configured to process a reference clock signal and the output clock signal generated by the multi-stage ring oscillator and adjust the selection signal to change the frequency of the output clock signal, wherein the calibration circuit comprises:
a first circuit configured to generate a first error signal indicative of a difference between the reference clock signal and the output clock signal; and
a proportional-integral circuit configured to generate a control signal from which the selection signal is generated in response to the first error signal.

15. The circuit of claim 14, wherein the calibration circuit further comprises:
a second circuit configured to determine whether the first error signal is within an offset from zero and if so generate a second error signal which is subtracted from the first error signal to generate a third error signal; and
said proportional-integral circuit configured to generate the control signal in response to the third error signal.

16. The circuit of claim 15, wherein the second circuit comprises:

a difference circuit configured to generate a difference signal as a function of a difference between consecutive samples of the first error signal; and a multiplier circuit configured to multiply the difference signal by a gain value to generate the second error signal.

17. The circuit of claim 14, wherein the calibration circuit further comprises:

a second circuit configured to determine if the control signal is saturated and if so generate a second error signal which is subtracted from the first error signal to generate a third error signal; and said proportional-integral circuit configured to generate the control signal in response to the third error signal.

18. The circuit of claim 14, wherein the first error signal is equal to a difference between a first ratio and a second ratio, wherein the first ratio is a ratio of the frequency of the reference clock signal to a frequency of the output clock signal and the second ratio is a ratio of a target frequency of the reference clock signal to the frequency of the output clock signal.

19. The circuit of claim 14, wherein the control signal is binary coded and the selection signal is thermometric coded, and the control circuit is configured to convert the binary coded control signal to the thermometric coded selection signal.

20. A calibration circuit for calibrating an oscillator circuit that receives a selection signal which sets a frequency of an output clock signal generated by the oscillator circuit, comprising:

a first circuit configured to generate a first error signal indicative of a difference between a reference clock signal and the output clock signal;

a second circuit configured to determine whether the first error signal is within an offset from zero and if so generate a second error signal;

a third circuit configured to subtract the second error signal from the first error signal to generate a third error signal; and a proportional-integral circuit configured to generate a control signal from which the selection signal is generated in response to the third error signal.

21. The circuit of claim 20, wherein the second circuit comprises:

a difference circuit configured to generate a difference signal as a function of a difference between consecutive samples of the first error signal; and a multiplier circuit configured to multiply the difference signal by a gain value to generate the second error signal.

22. The circuit of claim 20, wherein the first error signal is equal to a difference between a first ratio and a second ratio, wherein the first ratio is a ratio of the frequency of the reference clock signal to a frequency of the output clock signal and the second ratio is a ratio of a target frequency of the reference clock signal to the frequency of the output clock signal.

23. The circuit of claim 20, wherein the control signal is binary coded and the selection signal is thermometric coded, further comprising a fourth circuit configured to convert the binary coded control signal to the thermometric coded selection signal.

24. A calibration circuit for calibrating an oscillator circuit that receives a selection signal which sets a frequency of an output clock signal generated by the oscillator circuit, comprising:

a proportional-integral circuit configured to generate a control signal from which the selection signal is generated;

a first circuit configured to generate a first error signal indicative of a difference between a reference clock signal and the output clock signal;

a second circuit configured to determine if the control signal is saturated and if so generate a second error signal; and a third circuit configured to subtract the second error signal from the first error signal to generate a third error signal;

wherein said proportional-integral circuit is configured to generate the control signal in response to the third error signal.

25. The circuit of claim 24, wherein the first error signal is equal to a difference between a first ratio and a second ratio, wherein the first ratio is a ratio of the frequency of the reference clock signal to a frequency of the output clock signal and the second ratio is a ratio of a target frequency of the reference clock signal to the frequency of the output clock signal.

26. The circuit of claim 24, wherein the control signal is binary coded and the selection signal is thermometric coded, and the control circuit is configured to convert the binary coded control signal to the thermometric coded selection signal.

27. A circuit, comprising:

a ring oscillator circuit including a plurality of inverter circuits coupled in series with negative feedback and configured to generate an output clock signal;

a plurality of leakage current sources, wherein each current source is coupled to bias a corresponding inverter circuit of the ring oscillator circuit by generating a leakage current with a digitally controlled magnitude;

a control circuit configured to generate a selection signal applied to the plurality of current sources for setting the digitally controlled magnitude of the leakage current biasing each inverter circuit; and a calibration circuit configured to process a reference clock signal and the output clock signal generated by the ring oscillator and generate a control signal which adjusts the selection signal output by the control circuit to cause a ratio of the frequency of the reference clock signal to a frequency of the output clock signal to lock to a target frequency ratio.

28. The circuit of claim 27, wherein the calibration circuit is disabled after lock is achieved.

29. The circuit of claim 27, further comprising a crystal oscillator circuit configured to generate said reference clock signal, wherein the crystal oscillator circuit is disabled after lock is achieved.

30. The circuit of claim 27, wherein the target frequency ratio is a ratio of a target frequency of the reference clock signal to the frequency of the output clock signal.

31. The circuit of claim 27, wherein the control signal is binary coded and the selection signal is thermometric coded, and the control circuit is configured to convert the binary coded control signal to the thermometric coded selection signal.

32. The circuit of claim 27, wherein each leakage current source comprises a transistor having a conduction terminal outputting the leakage current and a control terminal tied to a voltage which sets said transistor to be turned off.

33. The circuit of claim 1, wherein each digitally controlled leakage current source comprises a transistor having a conduction terminal outputting the leakage current and a control terminal tied to a voltage which sets said transistor to be turned off.

\* \* \* \* \*